(12) United States Patent
Qian (10) Patent No.: US 7,145,917 B1
(45) Date of Patent: Dec. 5, 2006

(54) FRAME MATCHING METHOD AND APPARATUS FOR USE IN A COMMUNICATION SYSTEM

(75) Inventor: Feng Qian, Mission Viejo, CA (US)

(73) Assignee: VIA Telecom Co., Ltd. (KY)

( * ) Notice: Subject to any disclaimer, the term of this patent is extended or adjusted under 35 U.S.C. 154(b) by 1068 days.

(21) Appl. No.: 09/905,529

(22) Filed: Jul. 13, 2001

Related U.S. Application Data (60) Provisional application No. 60/219,724, filed on Jul. 19, 2000.

(51) Int. Cl.
*H04J 3/16* (2006.01)
*H03M 13/03* (2006.01)
*H04B 7/216* (2006.01)

(52) U.S. Cl. .................. 370/465; 370/468; 714/790
(58) Field of Classification Search ............... 370/465, 370/468, 342, 320; 714/790
See application file for complete search history.

(56) References Cited

U.S. PATENT DOCUMENTS 6,601,214 B1 * 7/2003 Hammons, Jr. ............ 714/790
6,621,873 B1 * 9/2003 Lee et al. .................. 375/295
6,819,718 B1 * 11/2004 Koehn et al. ............... 375/242
2004/0109495 A1 * 6/2004 Yoon et al. ................. 375/149

OTHER PUBLICATIONS

U.S. Appl. No. 09/687,700, filed Oct. 12, 2000, Feng Qian.
U.S. Appl. No. 09/686,786, filed Oct. 10, 2000, Feng Qian.

* cited by examiner

*Primary Examiner*—Steven Nguyen
*Assistant Examiner*—Nittaya Juntima
(74) *Attorney, Agent, or Firm*—Martin J. Jaquez, Esq.; Jaquez & Associates; William Boling, Esq.

(57) ABSTRACT

A novel frame-matching method and apparatus in a communication system is disclosed. The frame matching method and apparatus of the present invention matches or aligns flexible length data (e.g., symbols) to standard-sized frames without the need for non-standard puncturing. The method and apparatus of the present invention determines how many times to disable symbol puncturing based upon parameters associated with a given data set. The present invention is capable of disabling symbol puncturing for any given data bit, group of data or symbol.

22 Claims, 7 Drawing Sheets

FRAME MATCHING METHOD AND APPARATUS FOR USE IN A COMMUNICATION SYSTEM

CROSS-REFERENCE TO RELATED APPLICATIONS

This application claims the benefit under 35 USC § 119 of commonly-assigned, U.S. Provisional Application No. 60/219,724, filed Jul. 19, 2000, now abandoned, entitled "Augmenting Existing Data Puncturing Pattern for Frame Matching", and is related to commonly-assigned U.S. application Ser. No. 09/687,700 (now U.S. Pat. No. 6,891,853), filed Oct. 12, 2000, entitled "Frame Matching Method", and commonly-assigned U.S. application Ser. No. 09/686,786, filed Oct. 11, 2000, entitled "Frame Matching Method", and all three of these documents are hereby incorporated by reference herein in their entireties.

BACKGROUND OF THE INVENTION

1. Field of the Invention

This invention relates to communication systems, and more particularly to methods for frame matching in wireless communication systems.

2. Description of Related Art

Figure 1:
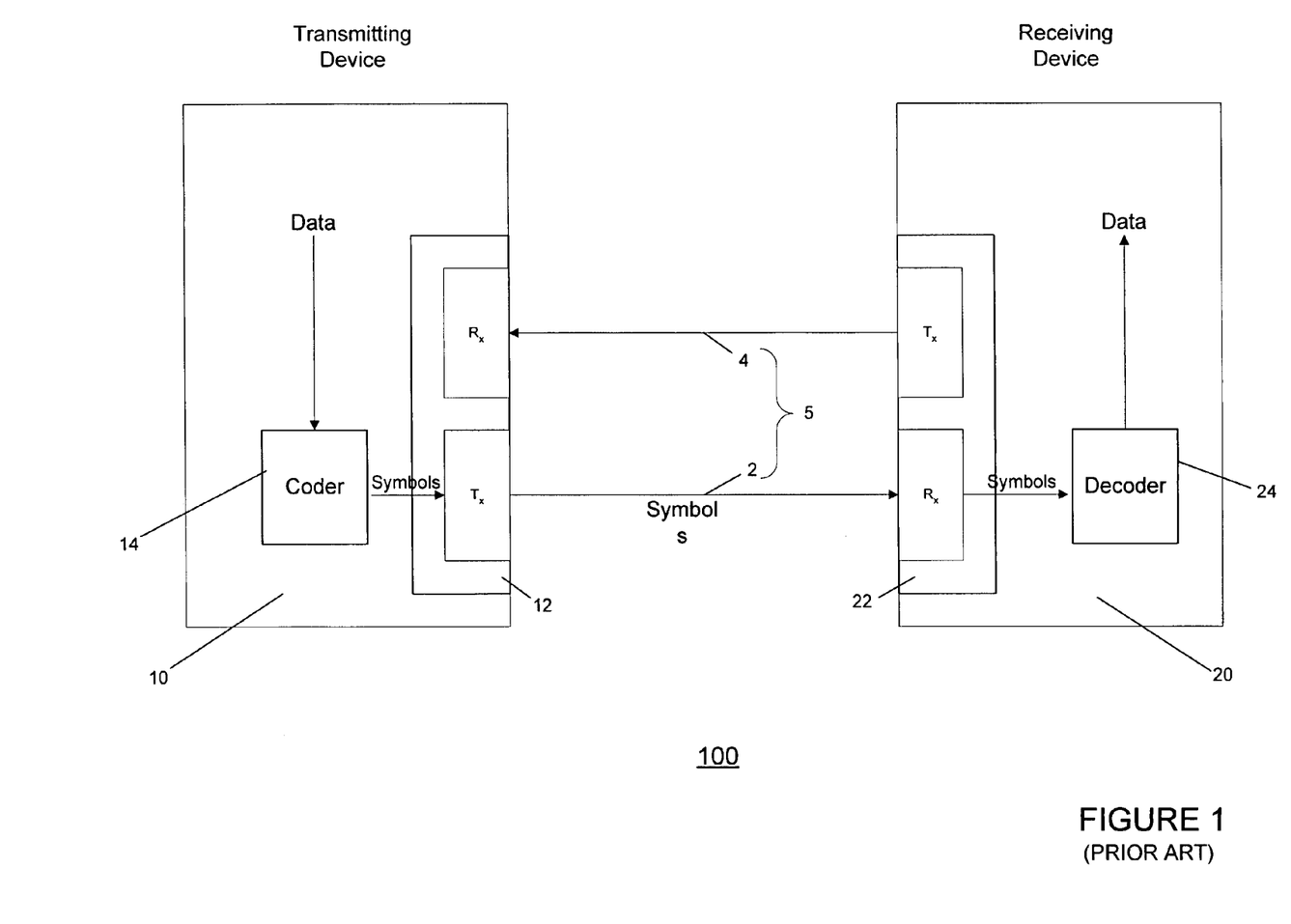
FIG. 1 shows an exemplary digital communication system.
Figure 2:
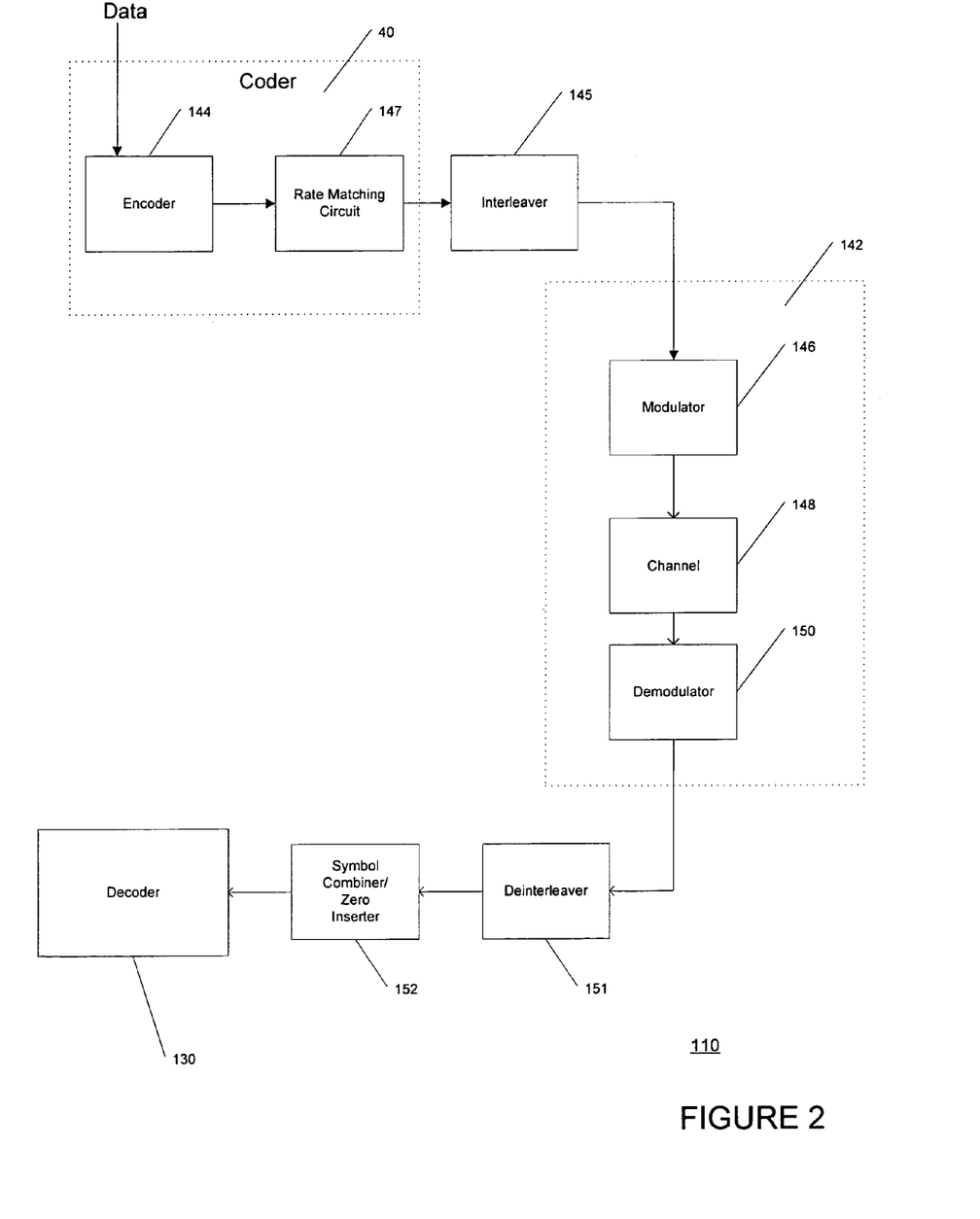
FIG. 2 shows a block diagram of an exemplary digital communication system adapted for use with the present invention.

Wireless communication systems facilitate two-way communication between a plurality of subscriber mobile radio stations or "mobile stations" and a fixed network infrastructure. Typically, the plurality of mobile stations communicates with the fixed network infrastructure via a plurality of fixed base stations. Exemplary systems include such mobile cellular telephone systems as Code Division Multiple Access (CDMA) systems, Time Division Multiple Access (TDMA) systems, and Frequency Division Multiple Access (FDMA) systems. The objective of these digital communication systems is to provide communication channels on demand between the mobile stations and the base stations in order to facilitate communication between the mobile station users, and also to allow connectively with a fixed network infrastructure (e.g., a wired "POTS" telecommunications system). An exemplary digital communication system is shown in FIG. 2 and described in detail as FIG. 1 in the above-incorporated U.S. application Ser. No. 09/687,700 (now U.S. Pat. No. 6,891,853).

Another exemplary digital communication system is now described with reference to FIG. 1. As described hereinbelow and in the incorporated U.S. application Ser. No. 09/687,700, digital communication systems transmit data between wireless devices over an airlink. As shown in FIG. 1, a transmitting device 10 communicates with a receiving device 20 via an airlink 5. The airlink 5 comprises a forward link 2 and a reverse link 4. The transmitting device 10 comprises a coder 14 operatively connected to a radio 12. The receiving device 20 comprises a radio 22 operatively connected to a decoder 24.

As shown in FIG. 1, the transmitting device 10 processes data and transmits symbols across the airlink 5. The coder 14 inputs data streams that are generated by devices within the transmitting device 10 (such as a well-known vocoder, not shown in FIG. 1). The coder 14 processes the data and outputs encoded symbols, or "data groups", at a predetermined symbol code rate. Symbol code rates are defined as the number of symbols that an encoder generates per frame. Symbol code rates are sometimes referred to as native symbol rates. These symbols are configured into well-known "frame structures" or "frames". Exemplary frames and frame structures are described in chapters 2 and 3 of the TIA specification entitled "Physical Layer Standard for cdma2000.2 Standards for Spread Spectrum Systems", TIA/EIA/IS-2000.2-A, published in March 2000 by the Telecommunications Industry Association (TIA), and is hereby incorporated by reference for its teachings on CDMA communication systems, and is referred to hereafter as "IS-2000.2".

Referring to FIG. 1 and as is well known, radio 12 transmits frames of data across the airlink 5 (i.e., at the physical layer) to the receiving device 20 at a specified transmission code rate. Transmission code rates are defined by the number of symbols transmitted per frame. Transmission code rates are sometimes referred to as symbol rates of a particular frame configuration. The decoder 24 receives the frames and outputs data for use by other components in the receiving device 20. Typically, digital communication systems, such as CDMA systems, utilize a plurality of multi-sized frame structures.

Exemplary prior art CDMA systems are described in the TIA specification, entitled "Mobile Station-Base Station Compatibility Standard for Dual-Mode Wideband Spread Spectrum Cellular System," TIA/EIA/IS-95-A, published in May 1995 by the Telecommunications Industry Association, and referred to hereafter as "IS-95A". The update and revision to IS-95A and J-STD-008 (PCS specification analogous to IS-95A) is TIA/EIA/IS-95-B, which was published in March 1999 by the Telecommunications Industry Association (TIA), and is referred to hereafter as "IS-95B". The IS-95A and IS-95B specifications jointly specify the second generation, or "2G", CDMA system. More recently, a third generation, or "3G" CDMA system, is described in the TIA specification, and is entitled "cdma2000 Series", TIA/EIA/IS-2000-A. The TIA/EIA/IS-2000-A specification was published in March 2000 by the TIA, and is referred to hereafter as "IS-2000". The IS-95A, IS-95B and IS-2000 specifications are hereby incorporated by reference for their teachings on CDMA communication systems. In 2G systems, only a limited number of usable data frame sizes are utilized because data must be encoded at a specified symbol code rate. In contrast, 3G systems support arbitrary data frame sizes.

In order to support arbitrary data frame sizes, one encoding method, referred to as a "data-to-frame matching" method, attempts to overcome this drawback by "matching" (or aligning) the specified symbol code rate to the specified transmission code rate. In accordance with this encoding method, encoded symbols are "fitted", or adjusted to fit into, standard frame structures using techniques such as symbol repetition and puncturing. Symbol or code repetition is defined as the concatenation or addition of redundant code symbols from a sequence that is generated by an encoder. Consequently, a lower rate coder can be used, or equivalently, the amount of symbols that are transmitted can be increased. Symbol or code puncturing is defined as the deletion of code symbols from a sequence generated by an encoder. A higher rate coder results, or equivalently the amount of symbols that are transmitted is reduced.

For example, in a CDMA system configured in accordance with IS-2000, encoded symbols having a symbol code rate of L symbols per frame must be matched with a transmission scheme having a transmission code rate (or processing rate) of N symbols per frame, where N is greater than L. Accordingly, for any given frame, the L symbols are repeated M times, where M is the smallest integer such that (M*L)>N, where "*" is defined as the well-known mathematical multiplication function. The (M*L) symbols are then reduced to N symbols by puncturing (i.e., deleting) P symbols, where P=((M*L)–N). When symbols are properly punctured (i.e., punctured without error) no appreciable loss of information occurs because, as is well known in CDMA systems, many symbols are redundant to provide robust protection against transmission errors. Thus, the proper deletion of a few redundant symbols typically does not cause significant problems, especially when the redundant symbols are spaced far apart from each other. Symbol repetition and puncturing techniques, basic radio system parameters and call processing procedures for prior art CDMA systems are described in the above-incorporated IS-95A, IS-95B and IS-2000.

Accordingly, one objective of digital communication systems is to match data having flexible data lengths to multi-sized frames, and thus facilitating the transmission of data on the physical layer. One exemplary data-to-frame matching method and apparatus that attempts to achieve this objective is now described with reference to FIG. 1. Referring again to the exemplary digital communication system 100 of FIG. 1, the coder 14 includes an encoder that is operatively connected to a rate matching circuit (not shown in FIG. 1). The exemplary encoder received raw data and outputs encoded symbols. For example, as described in IS-95A with reference to FIGS. 6.1.3.1–2 at pages 6–8, an encoder may perform the following functions: include frame quality indicators, add an 8-bit encoder tail and perform convolutional encoding. The encoder outputs the encoded symbols to an input of the rate matching circuit.

The exemplary rate matching circuit matches the input symbols to multi-sized frames in accordance with the symbol code rate and the transmission code rate of the frame. In accordance with the exemplary data-to-frame matching method, the rate matching circuit is capable of performing three functions: 1) standard rate matching via either simple repetition or periodic deletion of symbols; 2) flexible symbol repetition (utilized in cases where the symbol code rate is less than the transmission code rate that is associated with the specified frame and simple repetition or periodic deletion of symbols does not produce a required transmission rate.); and 3) flexible symbol puncturing (utilized in cases where the symbol code rate is greater than the transmission code rate that is associated with the specified frame and simple repetition or periodic deletion of symbols does not produce a required transmission rate.) Thus, the rate matching circuit of the exemplary method performs standard rate matching, symbol repetition or puncturing to match the symbols to the specified frames.

One disadvantage of the above-described exemplary data-to-frame matching method is that utilization of non-standard puncturing results in unpredictable performance. Performance is defined as how well a method functions. In communication systems, performance is typically measured by using the signal-to-noise ratios needed to achieve a certain pre-specified information bit error rate (BER). In the above-described exemplary data-to-frame matching method, the performance of the system is unpredictable. Under certain scenarios, the performance improves, however, in other scenarios, it worsens. Most CDMA systems, such as those defined by IS-2000, typically require that performance levels remain above predefined minimum levels. Performance levels can drop below minimum levels due to the deleterious effects that are associated with non-standard puncturing. Another disadvantage of the exemplary data-to-frame matching method results from the utilization of non-standard puncturing, which results in increased design, increased manufacturing costs and complexity.

Therefore, a need exists for a frame matching method and apparatus which augments existing, or standard, data puncturing techniques in communication systems. The frame matching method and apparatus should match data streams having a plurality of different code rates to various frame sizes. Such a frame matching method and apparatus should maintain a minimum level of performance. In addition, the frame matching method should utilize existing or standard data puncturing techniques without adding undue costs and complexities. The present invention provides such a frame matching method and apparatus.

SUMMARY OF THE INVENTION

The present invention is a novel frame matching method and apparatus for use in digital communication systems. The frame matching method and apparatus of the present invention matches, or aligns, flexible length data (e.g., symbols) to standard-sized frames without using non-standard puncturing techniques. The method and apparatus of the present invention determines a number of times to disable symbol puncturing based upon parameters associated with a data set. The present invention is capable of disabling symbol puncturing for any given data bit, group of data, or symbol.

The method and apparatus of the present invention maintains or improves the performance of a communication system that has standard frame sizes. System parameters are usually chosen to optimize this performance. Specifically, for non-standard symbol code rates, the present invention disables puncturing for certain symbols during the frame matching process. Utilization of the techniques of the present invention allows coders and associated rate matching circuits to operate without using non-standard puncturing patterns.

The details of the embodiments of the present invention are set forth in the accompanying drawings and the description below. Once the details of the invention are known, numerous additional innovations and changes will become obvious to one skilled in the art.

BRIEF DESCRIPTION OF THE DRAWINGS

Like reference numbers and designations in the various drawings indicate like elements.

DETAILED DESCRIPTION OF THE INVENTION

Throughout this description, the embodiments and examples shown should be considered as exemplars, rather than as limitations on the present invention.

The method and apparatus of the present invention maintains or improves the performance that is associated with data-to-frame matching techniques in a communication system. Specifically, during symbol puncturing of data that uses a non-standard symbol code rate, the present invention disables puncturing for certain symbols during frame matching. Standard symbol code rates are symbol code rates that produce an exact number of symbols that fit into a selected transmission frame. Non-standard symbol code rates are symbol code rates that produce too many or too few symbols, and thus do not fit into a selected transmission frame. As is well known, when data puncturing is disabled, performance improves and transmission code rates increase. Using the data puncturing techniques of the present invention, coders and associated rate matching circuits can operate using non-standard data puncturing patterns.

One function of the frame matching method and apparatus of the present invention is to match flexible length data to standard-sized frames without the necessity of using non-standard puncturing techniques. The method and apparatus of the present invention determines the number of times to disable symbol puncturing based upon parameters associated with a data set such as data length. The present invention is capable of disabling symbol puncturing for any given data bit, group of data or symbol.

Several embodiments of the present invention are described. For example, in one embodiment, symbol puncturing of a puncture pattern group for a standard frame size is disabled in a pseudorandom fashion. In another embodiment of the present invention, some puncturing in each puncture pattern group for a standard frame size is disabled; and the method pseudo-randomly selects one of the two puncturing patterns that differ by only one bit for puncturing. Thus, advantageously, minimum code distances can be increased. Code distance is defined as a number of data bits that differ between two sets of data bits that have the same length.

The present inventive method and apparatus is primarily intended for use in communication systems such as CDMA systems. An exemplary wireless digital communication system adapted for use in the frame matching method and apparatus is described. However, as those of ordinary skill in the art will appreciate, any convenient digital communication system (wired or wireless) can be used to practice the present invention provided that the system is capable of performing a frame matching function by puncturing symbols and by disabling the puncturing mechanism. The present invention can be used in any digital communication system where maintaining and improving performance during frame matching is desirable.

An Exemplary Wireless Digital Communication System Adapted for Use with the Present Frame Matching Method and Apparatus The present inventive method and apparatus is intended for use in wireless digital communication systems. Examples of wireless digital communication systems include CDMA and TDMA systems. The system description is not meant as a limitation to the present invention as the invention can be used in any digital communication system that performs frame matching. FIG. 2 shows a block diagram of an exemplary digital communication system adapted for use with the present invention. As shown in FIG. 2, the digital communication system 110 comprises a coder 40, an interleaver 145, a discrete-time channel 142, a deinterleaver 151, a symbol combiner/zero inserter 152 and a decoder 130.

The coder 40 comprises an encoder 144 and a rate matching circuit 147. The encoder 144 is capable of inputting data from a plurality of data sources such as a vocoder. The encoder 144 outputs signals to an input of the rate matching circuit 147. The rate matching circuit 147 outputs signals to an input of the interleaver 145. The interleaver 145 outputs signals to an input of the discrete-time channel 142.

The discrete-time channel 142 comprises a modulator 146, a channel 148 and a demodulator 150. The interleaver 145 outputs signals to an input of the modulator 146. The modulator 146 outputs signals to an input of the channel 148. The channel 148 can comprise a transmission channel or a storage medium. The channel 148 outputs signals to an input of the demodulator 150. The demodulator 150 outputs signals to an input of the deinterleaver 151. The deinterleaver 151 outputs signals to an input of the symbol combiner/zero inserter 152. The symbol combiner/zero inserter 152 outputs signals to the input of the decoder 130. An exemplary data transmission in the digital communication system 100 is now described with reference to FIG. 2.

During data transmission, the encoder 144 receives data from a data source such as a vocoder (not shown). The encoder 144 processes data into symbols and outputs these symbols to an input of the rate matching circuit 147. The rate matching circuit 147 is capable of performing standard rate matching, symbol repetition or data puncturing techniques in order to match symbols to transmission frames. The interleaver 145 receives a digital output signal comprising symbols from the rate matching circuit 147. The interleaver 145 interleaves this digital output signal over a certain time period, which is usually predetermined and known as a frame. The exemplary digital communication system 110 of FIG. 2 utilizes a plurality of frame structures, wherein the frame structures vary in size. Thus, the plurality of frame structures or frames can accommodate a plurality of code rates. The interleaver 145 transmits the digital output signal to the modulator 146.

The modulator 146 translates the digital output signal from the interleaver 145 into signals that are suitable for the channel 148 and thereafter transmits these signals across the channel 148. The channel 148 may suffer from interference that corrupts the signals, the interference possibly taking form in any combination of additive noise, cross channel interference, multi-path interference, and channel fading. The demodulator 150 inputs the signals from the channel 148 and translates the signals into digital signals for input to the deinterleaver 151. The deinterleaver 151 deinterleaves the digital signals and outputs the signals to the symbol combiner/zero inserter 152.

The symbol combiner/zero inserter 152 combines repeated symbols utilizing well-known methods such as maximum likelihood combining and inserts neutral values (e.g., zero values) for punctured symbols. In one embodiment, reverse-frame matching is utilized wherein punctured symbol locations can be determined by a receiver copy of a transmitter pseudorandom generator. The symbol combiner/zero inserter 152 outputs the combined signals to the decoder 130. In one embodiment of the exemplary digital communication system 110, the encoder 144 comprises an encoder that operates in accordance with the well-known TurboCode™ specification.

In another embodiment of the exemplary digital communication system 110, the encoder 144 comprises a convolutional encoder which adds redundancy information to the input data. In accordance with this embodiment, the encoder 144 outputs L symbols per frame, which must be matched with the interleaver 145, which interleaves N symbols per frame, where N is greater than L. The rate matching circuit 147 matches the symbol code rate (i.e., L symbols per frame) to the transmission code rate (i.e., N symbols per frame) by repeating the L symbols of an input frame in such a manner that an N-symbol frame is produced. Rate matching using standard rate matching, symbol repetition and puncturing techniques is well known in the communications art. Exemplary standard rate matching, symbol repetition and puncturing techniques are described in more detail in the incorporated IS-95A, IS-95B and IS-2000 specifications.

One important function of the frame matching method and apparatus of the present invention is to puncture symbols in order to match symbol code rates to transmission code rates. The method and apparatus of the present invention determines a number of times to disable the symbol puncturing technique during standard puncturing patterns. The frame matching method and apparatus of the present invention achieves this important goal by using an inventive augmenting data puncturing technique. The frame matching method and apparatus of the present invention then performs puncturing in accordance with the inventive technique without use of non-standard puncturing patterns. One skilled in the communication art shall recognize that the frame matching method and apparatus can be used to match standard and non-standard code rates. Several embodiments of the rate matching circuit of the present invention are now described in more detail below.

Rate Matching Circuit of the Present Invention

The rate matching circuit of the present invention makes use of the observation that symbol puncturing can be selectively disabled for certain symbols, and thus non-standard puncturing rates can be matched without using non-standard puncturing patterns. In general for a communication system, and as is well known, performance improves and transmission code rates increases when data puncturing is disabled. The rate matching circuit embodiment of the present invention can be used in digital communication systems having multiple fixed-sized frames or standard-sized frames.

Figure 3:
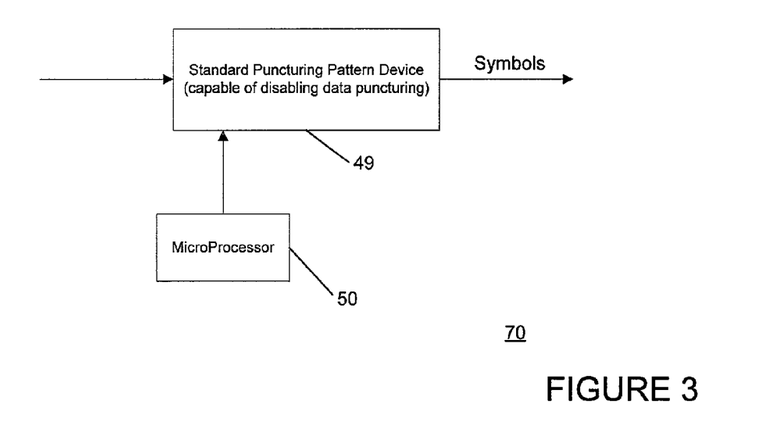
FIG. 3 shows a simplified block diagram of first embodiment of the rate matching circuit of the present invention.

FIG. 3 shows a simplified bock diagram of first embodiment of the rate matching circuit of the present invention. As shown in FIG. 3, the first embodiment 70 includes a standard puncturing pattern device 49. The standard puncturing pattern device 49 is capable of receiving symbols generated by an encoder (not shown) and outputting symbols to the input of an interleaver (not shown). The standard puncturing pattern device 49 is capable of disabling data puncturing for individual symbols. Data puncturing is disabled by the device 49 in accordance with an inventive augmenting existing data puncturing technique described below.

The standard puncturing pattern device 49 receives information and instructions pertaining to the data puncturing disablement process from a microprocessor 50. Examples of the information provided by the microprocessor 50 include: the number of times to disable puncturing for a frame or time length; symbol priority regarding puncturing disabling; and specified times to disable data puncturing. In one embodiment, the rate matching circuit 70 includes the microprocessor 50. However, alternatives are possible. For example, in another embodiment, the microprocessor 50 is external to the rate matching circuit 70. One skilled in the communication art shall recognize that utilization of the microprocessor 50 is not meant to limit the scope of the present invention as other logic devices can be utilized with the present invention. Examples include logic gate arrays, VLSIs and ASICs, state machines, present state-next state discrete logic and field programmable gate array devices. A second embodiment of the present inventive rate matching circuit is now described with reference to FIG. 4.

Figure 4:
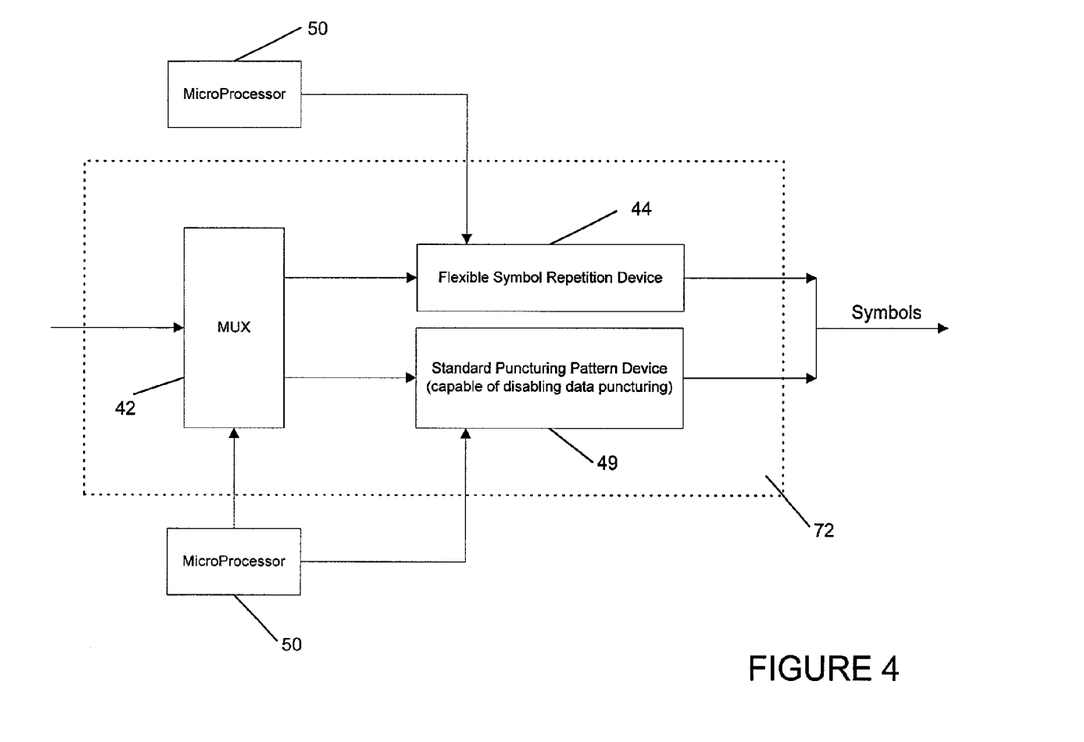
FIG. 4 shows a simplified block diagram of second embodiment of the rate matching circuit of the present invention.

FIG. 4 shows a simplified bock diagram of a second embodiment of the rate matching circuit of the present invention. As shown in FIG. 4, the second embodiment 72 comprises a multiplexer 42, a flexible symbol repetition device 44 and a standard puncturing pattern device 49. The multiplexer 42 is capable of receiving symbols from an encoder (not shown) and receiving control data from a microprocessor 50. Depending upon the control data received from the microprocessor 50, the multiplexer 42 outputs symbols to either the flexible symbol repetition device 44 or the standard puncturing pattern device 49. In accordance with well-known rate matching techniques, the multiplexer 42 outputs symbols to the flexible symbol repetition device 44 when the symbol code rate produces too few symbols to complete a frame. When the symbol code rate produces too many symbols to fit into a frame, the multiplexer 42 outputs symbols to the standard puncturing pattern device 49. Symbol repetition techniques are well known in the communication art and thus are not described in more detail herein. One exemplary repetition technique is described in the incorporated U.S. application Ser. No. 09/687,700 (now U.S. Pat. No. 6,891,853).

The standard puncturing pattern device 49 of the second embodiment 72 of the present inventive rate matching circuit is described above with reference to the first embodiment 70 (FIG. 3), and thus is not described again herein. The standard puncturing pattern device 49 disables data puncturing in accordance with an inventive augmenting existing data puncturing technique described below. Both the flexible symbol repetition device 44 and the standard puncturing pattern device 49 output symbols to an interleaver (not shown).

Two embodiments of the rate matching circuit of the present invention have been described with reference to FIGS. 3 and 4. Either of these embodiments can be utilized in conjunction with the augmenting existing data puncturing technique that is now described.

Augmenting Existing Data Puncturing Technique for Frame Matching of the Present Invention An inventive technique for frame matching, as utilized in conjunction with the exemplary digital communication system of FIG. 2 and the rate matching circuits of FIGS. 3 and 4, is now described. The inventive data puncturing technique augments standard data puncturing by selectively disabling symbol puncturing. Advantageously, in a communication system, performance improves and transmission code rates generally increase when data puncturing is disabled.

Figure 5:
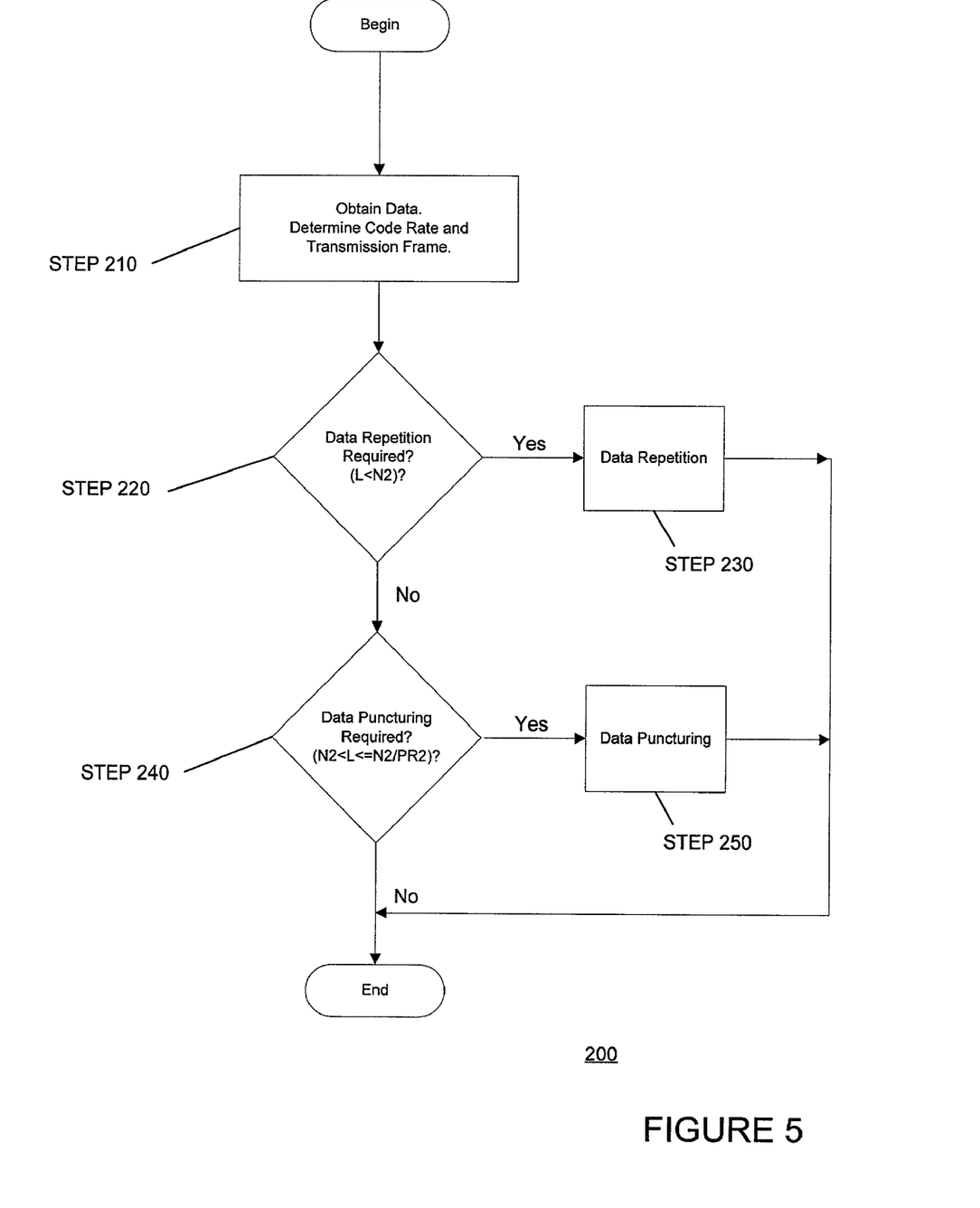
FIG. 5 shows a flowchart of an exemplary frame matching technique of the present invention.

FIG. 5 shows a flowchart of an exemplary frame matching method of the present invention. As shown in FIG. 5, the exemplary frame matching method 200 starts at a STEP 210 whereat the technique obtains symbol data after channel coding is performed by an encoder, but before symbol puncturing is performed. A transmission frame suitable for transmitting the symbol data is selected from a plurality of multi-sized frames. The inventive technique 200 determines a suitable transmission frame based upon the length of the symbol data. In one embodiment, the technique selects a transmission frame that is equal to or slightly greater than the length of the symbol data multiplied by the puncture retaining ratio of the transmission frame. The puncture retaining ratio, or puncture ratio (PR), is a ratio of the number of bits remaining after symbol puncturing is performed to the total number of bits in a puncture pattern group. A puncture pattern group (PPG) is a set of data bits to be punctured in a single puncturing iteration or period.

In accordance with one embodiment, at the STEP 210, the technique 200 selects transmission frame N2 using the following Equation 1:

$$N1/PR1 < L <= N2/PR2;\qquad\text{Equation (1)}$$

where
L is the length of the symbol data;
N1 and N2 are adjacent frame sizes, where N1<N2; and
PR1 and PR2 are the PR for N1 and N2, respectively.

Those skilled in the communications art shall recognize that alternative means for selecting the frame N2 can be used without departing from the scope of the present invention. After selecting a transmission frame N2, the technique proceeds to a decision STEP 220.

At the decision STEP 220, the inventive frame matching method determines whether the symbol data requires data repetition in order to match or align with the selected transmission frame, N2. If so, the method proceeds to a STEP 230 whereat data repetition is performed, else the method proceeds to a decision STEP 240. At STEP 240, the method determines whether the symbol data requires data puncturing. In one embodiment, the method determines whether L<N2, where N2<=N2/PR2 (by definition). If L<N2, the method proceeds to the STEP 230, else the method proceeds to the decision STEP 240. At the STEP 230, the method 200 performs data repetition in a well-known manner. After the STEP 230, the method terminates.

As shown in FIG. 5, at the decision STEP 240, the inventive method determines whether the symbol data requires data puncturing in order to match or align with the selected transmission frame, N2. If so, the method proceeds to a STEP 250 whereat data puncturing is performed, else the method terminates. In one embodiment, at STEP 240, the method determines whether N2<L<=N2/PR2. If N2<L<=N2/PR2, the method proceeds to the STEP 250, else the method terminates. At the STEP 250, the method punctures data according to the inventive data puncturing techniques of the present invention. An exemplary data puncturing technique is now described in detail with reference to FIG. 6.

Figure 6:
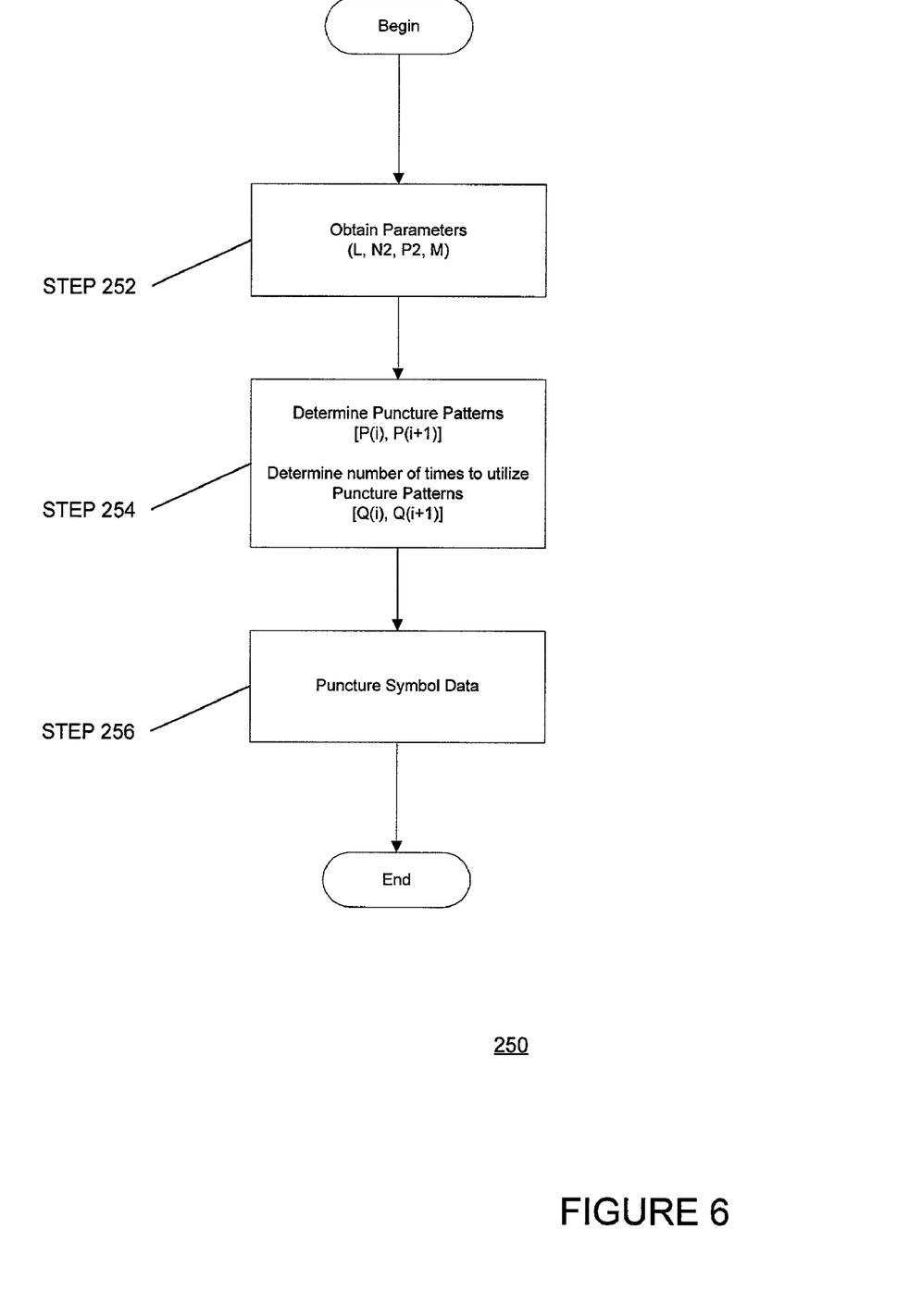
FIG. 6 shows a flowchart of an exemplary inventive puncturing technique of the present invention.

FIG. 6 shows a flowchart of a data puncturing technique of the present invention. As shown in FIG. 6, the exemplary data puncturing technique 250 starts at a STEP 252 whereat the technique 250 obtains data puncturing parameters. In one embodiment, the parameters include a data length (L), a frame (N2), a PR associated with the frame (PR2), and a bit retention quantity (M). The bit retention quantity, M, indicates the number of bits retained after standard data puncturing is performed on a PPG. After the STEP 252, the data puncturing method proceeds to a STEP 254 whereat the method determines the number of times to disable data puncturing for the symbol data based on the parameters obtained at STEP 252.

In accordance with one embodiment of the present invention, the method, at STEP 254, determines a set of puncturing patterns to be utilized for puncturing and the number of times to use each puncturing pattern. As is well known, a data puncturing pattern or puncturing "mask" is a deletion rule that is used for periodic code deletion or symbol deletion. Techniques used for puncturing codes, such as those using combination logic arrays, are well known in the communications art, and thus are not described further herein. Exemplary puncturing code techniques are described in chapters 2.1.3.1 and 3.1.3.1 of the above-incorporated IS-2000.2. In accordance with one embodiment of the present invention, the set of data puncturing patterns comprises at least two adjacent puncturing patterns, P(i) and P(i+1), where P(i) and P(i+1) differ by only 1 symbol or bit location. Thus, the uniformity of data puncturing increases with regard to an entire data length or frame.

In one embodiment of the method 250, at STEP 254, the method determines a first puncture pattern (P(i)), an adjacent second puncture pattern (P(i+1)), a number of times to use the first puncture pattern (Q(i)) and a number of times to use the second puncture pattern (Q(i+1)). After the STEP 254, the method proceeds to a STEP 256 whereat the method punctures symbol data based upon the set of puncturing patterns and number of times each puncturing pattern is used as determined in the STEP 254.

At the STEP 256, the inventive method punctures symbol data so that the output symbol data (i.e., punctured symbol data) is capable of being transmitted using a standard frame (e.g., N2). Those skilled in the communications art shall recognize that various methods for symbol data puncturing based on a set of puncturing patterns and based upon a number of times to use each puncturing pattern can be used to practice the present invention.

In a first exemplary embodiment, the method first utilizes P(i) Q(i) times and then utilizes P(i+1) Q(i+1) times on the remaining symbol data. In a second exemplary embodiment, the method first utilizes P(i+1) Q(i+1) times and then utilizes P(i) Q(i) times on the remaining symbol data. In a third exemplary embodiment, the method alternates between utilizing the puncturing patterns on the symbol data until only one puncturing pattern is required. In a fourth exemplary embodiment, the method utilizes the puncturing patterns in a random fashion. In a fifth exemplary embodiment, the method prioritizes symbols and disables puncturing higher priority symbols before disabling puncturing lower priority symbols. An exemplary embodiment of the puncture STEP 256 is described in detail below with reference to FIG. 8. As described below with reference to FIG. 8, the method punctures symbol data in a "pseudorandom" fashion.

Figure 7:
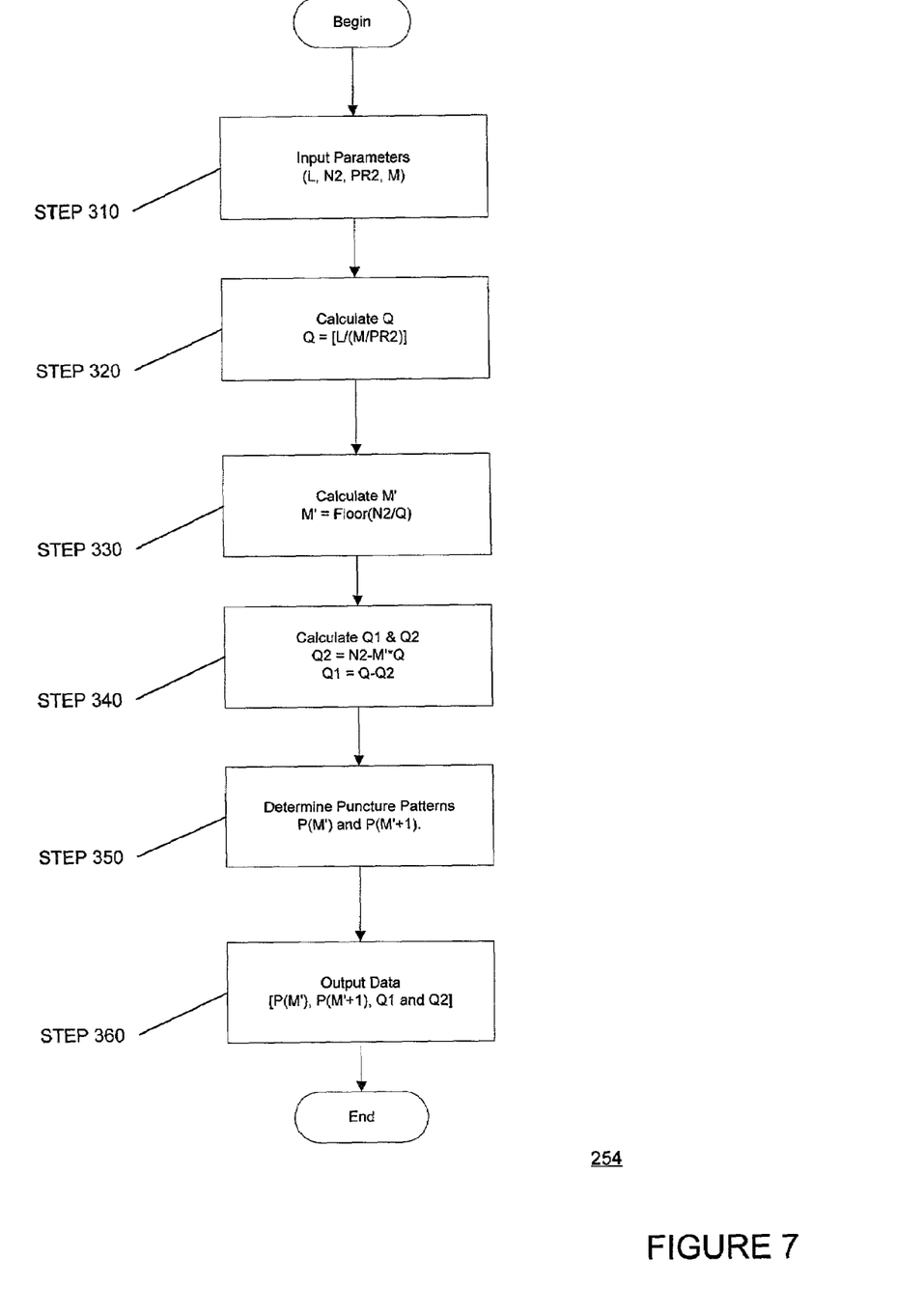
FIG. 7 shows a flowchart of an exemplary method used to determine a set of puncturing patterns to be utilized with the present invention.

FIG. 7 shows a flowchart of an exemplary method for determining a set of puncturing patterns to be utilized and for determining the number of times to utilize each puncturing pattern. As shown in FIG. 7, the method 254 determines a first puncture pattern (P(M')), an adjacent second puncture pattern (P(M'+1)), a number of times to utilize the first puncture pattern (Q1) and a number of times to utilize the second puncture pattern (Q2). M' is defined as the number of symbols retained after puncturing with the puncturing pattern P(M') and M'+1 is defined as the number of symbols retained after puncturing with the adjacent puncturing pattern P(M'+1). The P(M') puncture pattern is analogous to disabling puncturing, where the P(M'+1) puncture pattern is analogous to enabling standard puncturing. Thus, the method 254 determines a number of times to disable puncturing (i.e., Q1) and to enable standard puncturing (i.e., Q2).

As shown in FIG. 7, the method begins at a STEP 310 whereat the method receives data parameters. In one embodiment, the method receives the following parameters: a data length associated with the symbol data (L); a frame (N2); a PR associated with the frame (PR2); and a bit retention quantity (M) (i.e., the number of bits retained after standard puncturing of a PPG). After the STEP 310, the method proceeds to a STEP 320.

At the STEP 320, the method determines a value for "Q", a total number of puncture pattern groups associated with the symbol data. In one embodiment, the method determines Q based upon the following Equation 2:

$$Q=[L/(M/PR2)]; \quad \text{Equation (2)}$$

where
M=bit retention quantity;
PR2=puncture retaining ratio that is associated with N2;
L=data length that is associated with the symbol data.

After the STEP 320, the inventive method proceeds to a STEP 330.

As shown in FIG. 7, at the STEP 330, the method determines a value for "M'", wherein M' is defined as the number of symbols retained after puncturing with the puncturing pattern P(M'). In one embodiment, the value M' is calculated in accordance with the following Equation 3:

$$M'=\text{floor}(N2/Q); \quad \text{Equation (3)}$$

where N2=a frame;
Q=a total number of PPG associated with the symbol data.

The well-known "floor" function is a mathematical function that rounds a number down to a closest whole integer. After the STEP 330, the method proceeds to a STEP 340.

At the STEP 340, the method determines a value for Q1 (a number of times to utilize the first puncture pattern) and for Q2 (a number of times to utilize the second puncture pattern) utilizing the following Equations 4 and 5:

$$Q2=N2-(M'*Q); \quad \text{Equation (4)}$$

where
N2=a frame;
Q=a total number of PPG associated with the symbol data;
M'=the number of symbols retained after puncturing with the puncturing pattern P(M').

$$Q1=Q-Q2; \quad \text{Equation (5)}$$

where Q=a total number of PPG associated with the symbol data;
Q2=a number of times to utilize the second puncture pattern.

After the STEP 340, the method proceeds to a STEP 350.

At the STEP 350, the method determines adjacent puncturing patterns, P(M') and P(M'+1). Methods of determining adjacent puncturing patterns based on standard puncturing patterns are well known in the communications art and thus are not described in detail herein. Examples of standard puncturing patterns are described in chapters 2.1.3.1 and 3.1.3.1 of the above-incorporated IS-2000.2. Many well-known methods can be utilized to construct adjacent puncturing patterns. In one embodiment, a look-up table is used to determine the adjacent puncturing patterns. In another embodiment, user input is provided and the adjacent puncturing patterns are determined based upon the user input. In yet another embodiment, a logic array is used to determine the adjacent puncturing patterns. In some cases, an entire PPG can be disabled. In another example, disabling occurs somewhat uniformly by disabling some puncturing from each PPG. After the STEP 350, the method proceeds to a STEP 360 whereat the following information is output: Q1, Q2, P(M') and P(M'+1). After the STEP 360, the method terminates.

Figure 8:
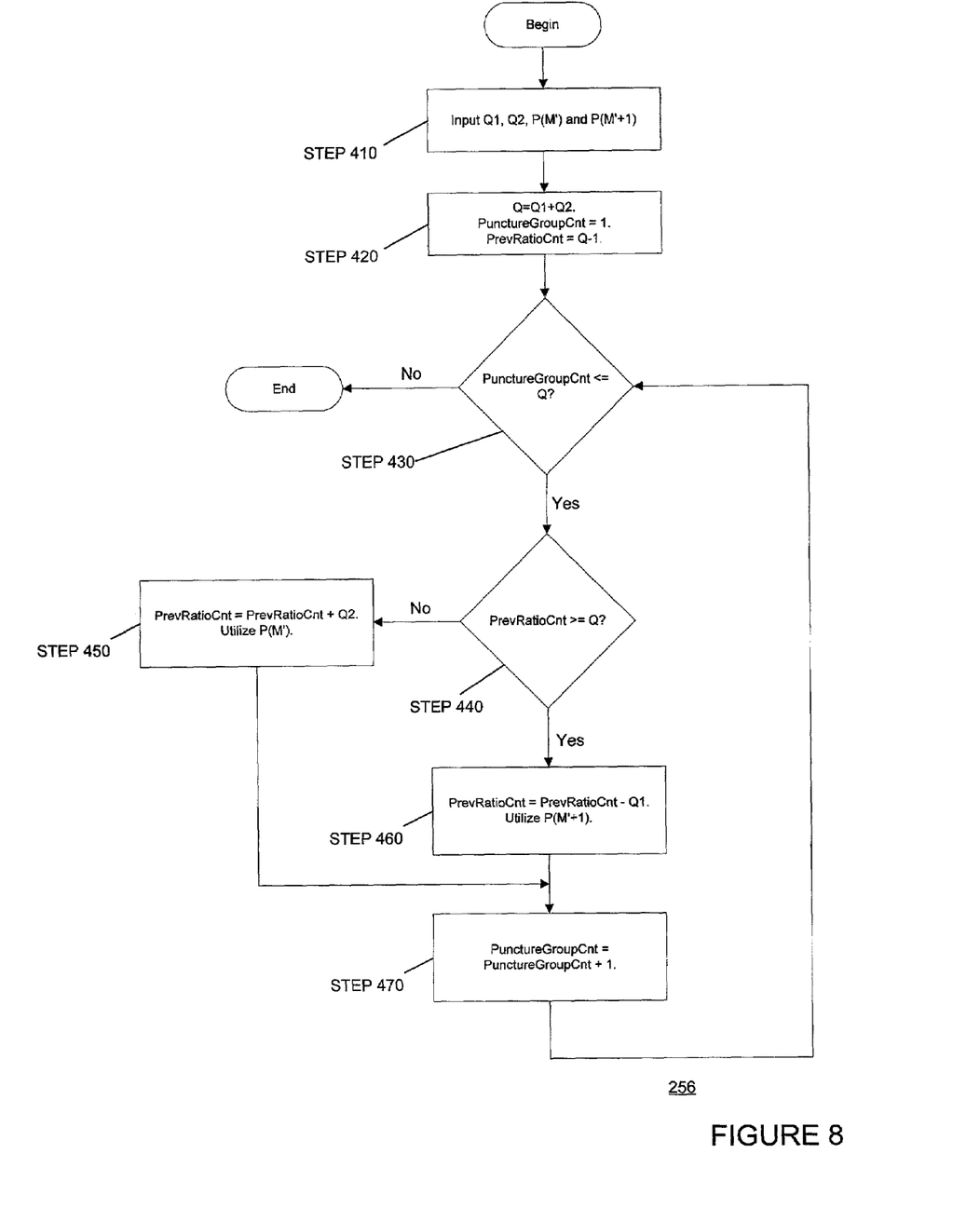
FIG. 8 shows a flowchart of an exemplary pseudorandom symbol data puncturing technique of the present invention.

FIG. 8 shows a flowchart of an exemplary pseudorandom symbol data puncturing technique of the present invention. As shown in FIG. 8, the method 256 begins at a STEP 410 whereat the method receives the following parameters: Q1, Q2, P(M') and P(M'+1). After the STEP 410, the method proceeds to a STEP 420 whereat the method calculates Q=Q1+Q2 and initializes the following counters: PunctureGroupCnt=1; and PrevRatioCnt=Q-1. After the STEP 420, the technique 256 proceeds to a decision STEP 430 whereat the technique 256 determines whether PunctureGroupCnt<=Q. If so, the technique 256 proceeds to a decision STEP 440, else the technique ends.

As shown in FIG. 8, a determination is made at the decision STEP 440. At the decision STEP 440, a determination is made as to whether PrevRatioCnt>=Q. If yes, the method proceeds to a STEP 460, else the method proceeds to a STEP 450. At the STEP 450, the method performs symbol puncturing using P(M') and sets PrevRatioCnt=PrevRatioCnt+Q2. After the STEP 450, the method proceeds to a STEP 470. At the STEP 460, the method performs symbol puncturing utilizing P(M'+1) and sets PrevRatioCnt=PrevRatioCnt−Q1. After the STEP 450, the method proceeds to a STEP 470. At the STEP 470, the inventive method sets PunctureGroupCnt=PunctureGroupCnt+1. After the STEP 470, the method returns to the decision STEP 430.

In summary, the frame matching method and apparatus of the present invention matches, or aligns, flexible length data (e.g., symbols) to standard-sized frames without the use of non-standard data puncturing patterns. The method and apparatus of the present invention determines the number of times symbol puncturing is disabled based upon parameters associated with a data set. The present invention is capable of disabling symbol puncturing for any given data bit, group of data, or symbol. Several techniques of the present invention have been described.

The method and apparatus of the present invention maintains or improves performance that is typically associated with data-to-frame matching in a communication system. Specifically, during symbol puncturing of data that uses a non-standard symbol code rate, during frame matching, the present invention disables data puncturing for certain symbols. The present invention allows for alignment of data symbols without need for using non-standard puncturing patterns.

A number of embodiments of the present invention have been described. Nevertheless, it will be understood that various modifications may be made without departing from the spirit and scope of the invention. For example, in one embodiment, symbol puncturing is disabled in a pseudorandom fashion. In another embodiment, adjacent puncturing patterns differ by only one bit, and thus, minimum code distances are advantageously increased.

Accordingly, it is to be understood that the invention is not to be limited by the specific illustrated embodiment, but only by the scope of the appended claims.

What is claimed is:

1. A frame matching method for use in a communication system, wherein the communication system includes at least one transmitting device and at least one receiving device, and wherein the at least one transmitting device includes an encoder and a rate matching device for matching data into a standard data frame, the method comprising the steps of:

a) obtaining a data set and the standard data frame, wherein the data set comprises a plurality of puncture pattern groups;

b) determining a standard puncture pattern and a puncture disable quantity based upon the data set obtained in step (a); and c) matching the data set into the standard data frame utilizing the standard puncture pattern and one or more same-length alternative patterns differing only in that puncture of selected bits that would be punctured according to the standard puncture pattern is disabled to retain a quantity of the selected bits equal to the puncture disable quantity obtained in step (b).

2. The frame matching method as defined in claim 1, wherein the obtaining step (a) further comprises obtaining a data length, a puncture retaining ratio and a bit retention quantity.

3. The method of claim 1, further comprising selecting a standard transmission frame for each data set from among a plurality of standard transmission frames having different lengths.

4. A frame matching method for use in a communication system, wherein the communication system includes at least one transmitting device and at least one receiving device, and wherein the at least one transmitting device includes an encoder and a rate matching device for matching data into a standard data frame, the method comprising the steps of:

a) obtaining a data set and the standard data frame, wherein the data set comprises a plurality of puncture pattern groups, a data length, a puncture retaining ratio and a bit retention quantity;

b) determining a first puncture pattern, a second puncture pattern, a first puncture pattern repetition quantity and a second puncture pattern repetition quantity and a puncture disable quantity based on the standard data frame, the data length, the puncture retaining ratio and the bit retention quantity obtained in step (a), wherein the first puncture pattern is a standard puncturing pattern and the second puncture pattern differs by disabling puncturing; and c) matching the data set into the standard data frame utilizing the standard puncture pattern and the puncture disable quantity obtained in step (b).

5. The frame matching method as defined in claim 4, wherein the determining step (b) comprises the sub-steps of:

i) determining Q utilizing the following equation: $Q=[L/(M/PR2)]$, where L=the data length, M=the bit retention quantity and PR2=the puncture retaining ratio;

ii) determining M' utilizing the following equation: $M'=floor(N2/Q)$, where N2=the standard frame;

iii) determining the second puncture pattern repetition quantity (Q2) utilizing the following equation: $Q2=N2-M'*Q$;

iv) determining the first puncture pattern repetition quantity (Q1) utilizing the following equation: $Q1=Q-Q2$; and v) determining the first puncture pattern and the second puncture pattern.

6. The frame matching method as defined in claim 4, wherein the matching step (c) comprises the sub-steps of:

i) puncturing data utilizing the first puncture pattern for a quantity of times approximately equivalent to the first puncture pattern repetition quantity; and ii) puncturing data utilizing the second puncture pattern for a quantity of times approximately equivalent to the second puncture pattern repetition quantity.

7. The frame matching method as defined in claim 6, wherein the sub-step (i) is performed before the sub-step (ii).

8. The frame matching method as defined in claim 6, wherein the sub-step (ii) is performed before the sub-step (i).

9. The frame matching method as defined in claim 6, wherein the sub-step (i) and (ii) are performed concurrently in an alternating fashion.

10. The frame matching method as defined in claim 6, wherein the sub-step (i) and (ii) are performed concurrently in a random fashion.

11. The frame matching method as defined in claim 6, wherein the sub-step (i) is performed on puncture pattern groups that have a higher priority.

12. The frame matching method as defined in claim 6, wherein the sub-step (i) is performed pseudorandomly.

13. A frame matching method for use in a communication system, wherein the communication system includes at least one transmitting device and at least one receiving device, and wherein the at least one transmitting device includes an encoder and a rate matching device for matching data into a standard data frame for transmission in the system, the method comprising the steps of:

a) obtaining a data set;

b) selecting a transmission data frame from a plurality of standard data frames;

c) determining whether data repetition is required for matching the data set to the transmission data frame, and if so, performing data repetition; and d) determining whether data puncturing is required for matching the data set to the transmission data frame by determining whether a data length that is associated with the data set is in accordance with following equation: $N2<L<N2/PR2$, where L=the data length that is associated with the data set, N2=the transmission data frame, PR2=a puncture retaining ratio that is associated with N2, and if so, performing data puncturing by puncture disabling techniques.

14. The frame matching method as defined in claim 13, wherein the determining whether data repetition is required step (c) comprises determining whether a data length associated with the data set is in accordance with following equation: $L<N2$, wherein L is the data length associated with the data set and N2 is the transmission data frame.

15. The frame matching method as defined in claim 13, further comprising selecting a standard transmission frame for each data set from among a plurality of standard transmission frames having different lengths.

16. A frame matching method for use in a communication system, wherein the communication system includes at least one transmitting device and at least one receiving device, and wherein the at least one transmitting device includes an encoder and a rate matching device for matching data into a standard data frame for transmission in the system, the method comprising the steps of:

a) obtaining a data set;

b) selecting a transmission data frame that is associated with a frame N2 in accordance with the following equation: $N1/PR1<L<N2/PR2$, where L=a data length that is associated with the data set, N1=a standard data frame that is smaller than and adjacent to N2, PR1=a puncture retaining ratio that is associated with N1 and PR2=a puncture retaining ratio that is associated with N2, from a plurality of standard data frames;

c) determining whether data repetition is required for matching the data set to the transmission data frame, and if so, performing data repetition; and d) determining whether data puncturing is required for matching the data set to the transmission data frame.

17. A coder, comprising:
   a) an input node for receiving a data set including a plurality of puncture pattern groups;
   b) a puncturing pattern device, operatively coupled to the input node to puncture the data set in accordance with only two puncturing patterns, consisting of a standard puncturing pattern and an alternative puncturing pattern differing from the standard pattern by disabling puncture of only one individual bit that would be punctured according to the standard pattern; and
   c) an output node, operatively coupled to the puncturing pattern device, capable of outputting data from the puncturing pattern device.

18. The coder as defined in claim 17, wherein the coder further comprises a microprocessor, operatively coupled to the puncturing pattern device, capable of transmitting a plurality of control commands to the puncturing pattern device, wherein the plurality of control commands comprise information regarding disabling puncturing.

19. The coder as defined in claim 17, wherein the puncturing pattern device is capable of operating in a puncturing data mode and a disable puncturing data mode.

20. The coder as defined in claim 19, wherein the puncturing pattern device utilizes a first puncture pattern when operating in the puncturing data mode and a second puncture pattern when operating in the disable puncturing data mode.

21. A frame matching method for use in a communication system, wherein the communication system includes at least one transmitting device and at least one receiving device, and wherein the at least one transmitting device includes an encoder and a rate matching device for matching data into a standard data frame for transmission in the system, the method comprising the steps of:
   a) obtaining a data set;
   b) selectin a transmission data frame from a plurality of standard data frames, including selecting a smallest standard frame size large enough to contain the data set if all puncture pattern groups (PPGs) therein are punctured in accordance with a particular standard puncture pattern;
   c) determining whether data repetition is required for matching the data set to the transmission data frame, and if so, performing data repetition; and
   d) determining whether data puncturing is required for matching the data set to the transmission data frame, and if so, performing data puncturing by puncture disabling techniques restricted to puncturing puncture pattern groups (PPGs) of data elements according to the particular standard puncturing pattern, or according to the particular standard puncturing pattern as augmented by disabling puncturing of a selected data element that would otherwise be punctured according to the standard puncturing pattern.

22. The method of claim 21, further comprising puncturing some of the PPGs therein in accordance with the standard puncture pattern which retains M data elements from each PPG, and puncturing all other PPGs in accordance with one or another variation of the standard puncture pattern in which puncturing of one ordinarily punctured data element is disabled to retain (M+1) data elements from PPGs thus punctured.

* * * * *

UNITED STATES PATENT AND TRADEMARK OFFICE
CERTIFICATE OF CORRECTION

| | | |
|---|---|---|
| PATENT NO. | : 7,145,917 B1 | Page 1 of 1 |
| APPLICATION NO. | : 09/905529 | |
| DATED | : December 5, 2006 | |
| INVENTOR(S) | : Feng Qian | |

It is certified that error appears in the above-identified patent and that said Letters Patent is hereby corrected as shown below:

On Title page of patent, under "Other Publications", please add --"Physical Layer Standard for cdma2000 Standards for Spread Spectrum Systems" Telecommunications Industry Association/Electronic Industries Alliance Interim Standard, TIA/EIA/IS-2000.2-A, published March 2000, pages 2-105 to 2-107 and 3-91 to 3-92-- and --Physical Layer Standard for cdma2000 Standards for Spread Spectrum Systems" Telecommunications Industry Association/Electronic Industries Alliance Interim Standard, Addendum 1, TIA/EIA/IS-2000.2-A-1, published November 2000, pages 2-115 to 2-117 and 3-96 to 3-98.--

Column 16, line 4, "selectin" should read --selecting--.

Signed and Sealed this

Seventeenth Day of June, 2008

JON W. DUDAS
*Director of the United States Patent and Trademark Office*